United States Patent
Mortazavi et al.

(10) Patent No.: US 9,595,971 B2
(45) Date of Patent: Mar. 14, 2017

(54) RING FREQUENCY DIVIDER

(71) Applicant: Cirrus Logic International Semiconductor Ltd., Edinburgh (GB)

(72) Inventors: Yousof Mortazavi, Austin, TX (US); John L. Melanson, Austin, TX (US); Aaron Brennan, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 15/159,750

(22) Filed: May 19, 2016

(65) Prior Publication Data

US 2016/0344392 A1 Nov. 24, 2016

Related U.S. Application Data

(60) Provisional application No. 62/164,355, filed on May 20, 2015.

(51) Int. Cl.
| | |
|---|---|
| *H03K 23/54* | (2006.01) |
| *G04F 10/02* | (2006.01) |
| *H03M 1/50* | (2006.01) |
| *H03K 3/03* | (2006.01) |
| *H03L 7/089* | (2006.01) |
| *H03L 7/099* | (2006.01) |
| *H03K 3/037* | (2006.01) |

(52) U.S. Cl.
CPC .............. *H03K 23/54* (2013.01); *G04F 10/02* (2013.01); *H03K 3/0315* (2013.01); *H03K 3/0372* (2013.01); *H03L 7/0891* (2013.01); *H03L 7/0995* (2013.01); *H03M 1/50* (2013.01)

(58) Field of Classification Search
None
See application file for complete search history.

(56) References Cited

U.S. PATENT DOCUMENTS

| | | | |
|---|---|---|---|
| 4,565,976 A | 1/1986 | Campbell | |
| 5,475,344 A * | 12/1995 | Maneatis | ............ H03K 3/0231 327/156 |
| 5,638,014 A | 6/1997 | Kurita | |

(Continued)

FOREIGN PATENT DOCUMENTS

| | | |
|---|---|---|
| GB | 2314710 A | 1/1998 |
| SU | 1437995 A2 | 11/1988 |
| WO | 2006126733 A1 | 11/2006 |

*Primary Examiner* — Howard Williams
(74) *Attorney, Agent, or Firm* — Norton Rose Fulbright US LLP

(57) ABSTRACT

A circuit for a divider or counter may include a frequency divider having multiple rings for dividing an input frequency to obtain an output frequency. The first and second rings may include an odd-numbered plurality of elements, such as inverters, wherein each inverter of a ring is coupled to another inverter of the ring in a circular chain. An input frequency may be input to a power supply input of inverters of the first ring. The second ring inverters may be coupled at a power supply input to output nodes of the first ring inverters, which results in the second ring operating at a divisional rate of the first frequency given by (N−1), where N is the number of inverters in the ring. The circuits may be used in frequency dividers and counters, such as in phase-locked loops (PLLs) and analog-to-digital converters (ADCs).

29 Claims, 18 Drawing Sheets

(56) References Cited

U.S. PATENT DOCUMENTS

| | | | |
|---|---|---|---|
| 5,864,258 A * | 1/1999 | Cusinato | H03K 3/013 |
| | | | 331/177 R |
| 5,955,906 A | 9/1999 | Yamaguchi | |
| 7,420,870 B2 * | 9/2008 | Park | H03K 3/0315 |
| | | | 327/156 |
| 8,138,958 B2 * | 3/2012 | Dai | G04F 10/005 |
| | | | 341/155 |
| 8,519,880 B2 * | 8/2013 | Kawaguchi | H03M 3/416 |
| | | | 341/111 |
| 9,018,987 B1 * | 4/2015 | Lahiri | H03K 3/0315 |
| | | | 327/114 |
| 2005/0237122 A1 | 10/2005 | Gu | |
| 2008/0252386 A1 | 10/2008 | Kim | |
| 2010/0124137 A1 | 5/2010 | Kim | |
| 2014/0306772 A1 | 10/2014 | Banin et al. | |
| 2016/0072514 A1 * | 3/2016 | Tsai | H03K 3/011 |
| | | | 331/47 |

* cited by examiner

RING FREQUENCY DIVIDER

CROSS-REFERENCE TO RELATED PATENT APPLICATIONS

This application claims the benefit of priority of U.S. Provisional Patent Application No. 62/164,355 to Yousof Mortazavi et al. filed on May 20, 2015 and entitled "Ring Frequency Dividers and Counters," which is hereby incorporated by reference.

FIELD OF THE DISCLOSURE

The instant disclosure relates to methods or implementations concerning or relating to frequency dividers and counters. More specifically, portions of this disclosure relate to low-power frequency dividers and counters used in conjunction with voltage- or current-controlled ring oscillators.

BACKGROUND

A frequency divider or a clock divider is a circuit that receives an input signal having a frequency $f_{in}$ and generates an output signal of a frequency:

$$f_{out} = f_{in}/n,$$

where n is an integer. A divider-based counter uses a frequency divider circuit and logic circuitry to generate a count from the edges of an input clock. Divider-based counters can be used in Voltage-Controlled Oscillator (VCO)/Current-Controlled Oscillator (CCO)-based quantizers. For low power operation, divider-based counters (e.g., asynchronous or ripple counters) provide power savings due to frequency division of each divider stage. In VCO/CCO-based quantizers, an input signal modulates the frequency of a ring oscillator, the phases of the ring oscillator may be sampled at certain time instances and the phase increment between consecutive samples determined. For every period of an N-stage ring oscillator where N is an odd integer greater than or equal to three, sampled ring outputs (e.g., N-bit outputs) may be decoded to 1 of 2N discrete states. Thus, a quantizer is obtained and provided with the 1 to 2N discrete states.

The least significant bits (LSB) of the quantizer obtained by sampling the ring oscillator's N outputs is $2\pi/2N$. In applications where the sampling of the phase is much slower than the frequency of oscillation, the phase may wrap around multiple times, creating ambiguity in the phase measurements. For example, if the phase is decoded to $k*2\pi/2N$, then it is possible that the phase increment between consecutive samples of the outputs of the ring oscillators was one of:

$$k\frac{2\pi}{2N},$$

$$(k+2N)\frac{2\pi}{2N},$$

$$(k+4N)\frac{2\pi}{2N},$$

$$(k+6N)\frac{2\pi}{2N},$$

or the like. Thus, improved dividers and counters that increase the number of states in the counter to remove the ambiguity are needed or desired.

Shortcomings mentioned here are only representative and are included simply to highlight that a need exists for improved electrical components, particularly for dividers, and electrical parts that include dividers, employed in consumer-level devices, such as mobile phones. Embodiments described herein address certain shortcomings but not necessarily each and every one described here or known in the art.

SUMMARY

A circuit for a divider or counter with improved precision may include a frequency divider having multiple rings for dividing an input frequency to obtain a different output frequency. The rings may be arranged in a concentric fashion, such that the output of each element of a first ring is used to control an element of a second ring. The first ring may include an odd-numbered plurality of elements, such as inverters, wherein each inverter is coupled to another inverter in a circular chain. Each of the first ring inverters may be coupled at a power supply input to an input node that receives a signal of a first frequency for division to a second frequency. The second ring may also include an odd-numbered plurality of elements, such as inverters, wherein an output of each inverter is coupled to an input of another inverter to form a circular chain. The second ring inverters may be coupled at a power supply input to output nodes of the first ring inverters. Additional rings may be coupled to the second ring inverters in a similar manner that the second ring inverters are coupled to the first ring inverters. These additional rings may provide further output signals at further divided frequencies.

These frequency dividers may be implemented in, for example, low-power frequency dividers and counters used in conjunction with voltage or current controlled ring oscillators. In some embodiments, the frequency dividers may be implemented in phase-locked loops (PLLs) or an analog-to-digital converter (ADC). Although rings of elements are described, the circuitry need not necessarily be organized in a device or in an integrated circuit in a circular fashion, but instead can be arranged in a linear or other fashion while still maintaining similar connections between the elements such that the elements operate similarly to those in the rings described herein.

According to one embodiment, an apparatus may include a first ring oscillator configured to be driven at a first frequency determined by an applied signal, and a second ring oscillator interconnected to the first ring oscillator, wherein the second ring oscillator is configured to operate at a second frequency that is the first frequency divided by an integer.

In certain embodiments of the apparatus, the first ring oscillator may include a first plurality of latches configured in a chain such that an input of each of the plurality of latches is an output of a different one of the first plurality of latches; the second ring oscillator may include a second plurality of latches configured in a chain such that an input of each of the second plurality of latches is an output of a different one of the second plurality of latches; the apparatus may also include a plurality of enable switches, wherein each of the second plurality of latches is coupled to a power supply through one of the plurality of enable switches, and wherein each of the plurality of enable switches is coupled to and toggled by an output of one of the first plurality of inverters; the plurality of enable switches may include only n-channel metal-oxide-semiconductor (NMOS) devices; the apparatus may also include a decoder coupled to the first ring oscillator and the second ring oscillator; the first ring oscillator and the second ring oscillator may generate an output based, at least in part, on a redundant numbering system, and wherein the decoder converts the output to a non-redundant numbering system; the first ring oscillator, the second ring oscillator, and the decoder may be coupled together to form a ring divider-based counter; the apparatus may also include a stuck state eliminator circuit coupled to at least one element of the second ring oscillator, wherein the stuck state eliminator circuit is configured to correct an error in at least one element of the second ring oscillator; at least one element of the second ring oscillator may include a latch with integrated stuck state elimination; the latch with integrated stuck state elimination may include a gated buffer followed by an inverter; the latch with integrated stuck state elimination may include an element with three inputs including a first input coupled to an output of a previous element of the second ring oscillator, a second input coupled to an output of an element of the second ring oscillator prior to the previous element, and a third input coupled to an inverted output of the first element of the second ring oscillator; and/or the apparatus may also include a third ring oscillator interconnected to the second ring oscillator, wherein the third ring oscillator is configured to operate at a third frequency that is the second frequency divided by an integer multiple.

According to another embodiment, a method may include driving a first ring oscillator at a first frequency determined by an applied signal, and driving a second ring oscillator from outputs of the first ring oscillator at a second frequency that is the first frequency divided by an integer.

In some embodiments, the method may further include decoding outputs of the first ring oscillator and the second ring oscillator to obtain a value; and/or driving a third ring oscillator from outputs of the second ring oscillator at a third frequency that is the second frequency divided by an integer.

In certain embodiments of the method, the step of driving the first ring oscillator may include applying a signal to a power supply input of a first plurality of elements of the first ring oscillator such that an output of each element of the first plurality of elements drives an input of a next element of the first plurality of elements to switch at the first frequency, and wherein the step of driving the second ring oscillator may include applying a plurality of outputs of the plurality of elements of the first ring oscillator to a power supply input of a second plurality of elements of the second ring oscillator; the step of applying the plurality of outputs of the plurality of elements of the first ring oscillator to the power supply input of the second plurality of elements of the second ring oscillator may include applying the plurality of outputs to a plurality of enable switches coupled between a power supply rail and the power supply input of the second plurality of elements; the steps of driving the first ring oscillator and driving the second ring oscillator generate a redundant numbering system, and wherein the step of decoding the outputs may include converting the redundant numbering system to a non-redundant numbering system; the step of driving the second ring oscillator may include driving at least one element of the second ring oscillator out of a stuck state; and/or the step of driving the at least one element of the second ring oscillator out of the stuck state may include correcting an error in at least one element such as an error in an initialized state; the step of driving the at least one element of the second ring oscillator out of the stuck state may include comparing an output of the at least one element to an output of a previous element in the second ring oscillator.

According to another embodiment, an analog-to-digital converter (ADC) may include an input node configured to receive an input analog signal, a current-controlled oscillator configured to receive the input analog signal, and a decoder coupled to an output of the current-controlled oscillator and configured to output digital bits representing the input analog signal. The current-controlled oscillator may include a first ring oscillator configured to be driven at a first frequency determined by the input analog signal, and a second ring oscillator interconnected to the first ring oscillator, wherein the second ring oscillator is configured to operate at a second frequency that is the first frequency divided by an integer. In some embodiments, the ADC may also include a voltage-to-current converter coupled between the input node and the current-controlled oscillator.

In certain embodiments of the analog-to-digital converter (ADC), the decoder may include a sampling circuit coupled to an output of the current-controlled oscillator, a phase decoder coupled to an output of the sampling circuit, and/or a differentiator coupled to an output of the phase decoder; the first ring oscillator may include a first plurality of latches configured in a chain such that an input of each of the plurality of latches is an output of a different one of the first plurality of latches, and wherein the second ring oscillator may include a second plurality of latches configured in a chain such that an input of each of the second plurality of latches is an output of a different one of the second plurality of latches; the current-controlled oscillator may include a plurality of enable switches, wherein each of the second plurality of latches is coupled to a power supply through one of the plurality of enable switches, and wherein each of the plurality of enable switches is coupled to and toggled by an output of one of the first plurality of inverters; the first ring oscillator and the second ring oscillator generate an output based, at least in part, on a redundant numbering system, and wherein the decoder converts the output to a non-redundant numbering system; the current-controlled oscillator may include a stuck state eliminator circuit coupled to at least one element of the second ring oscillator, wherein the stuck state eliminator circuit is configured to correct an error in at least one element of the second ring oscillator, such as an initialized state; at least one element of the second ring oscillator may include a latch with integrated stuck state elimination; the latch with integrated stuck state elimination may include a gated buffer followed by an inverter; the latch with integrated stuck state elimination may include an element with three inputs including a first input coupled to an output of a previous element of the second ring oscillator, a second input coupled to an output of an element of the second ring oscillator prior to the previous element, and a third input coupled to an inverted output of the first element of the second ring oscillator; and/or the current-controlled oscillator may include a third ring oscillator interconnected to the second ring oscillator, wherein the third ring oscillator is configured to operate at a third frequency that is the second frequency divided by an integer multiple.

According to a further embodiment, a phase-locked loop (PLL) system may include an input node configured to receive an input signal of a first frequency, a phase frequency detector coupled to the input node, a charge pump coupled to the phase frequency detector, a low-pass filter coupled to the charge pump, a voltage-controlled oscillator configured to receive an output of the low-pass filter, and an output node coupled to the first ring oscillator of the voltage-controlled oscillator and configured to generate an output signal of a second frequency that is an integer multiple of the first frequency. The voltage-controlled oscillator may include a first ring oscillator configured to be driven at a first frequency determined by the low-pass filter, and a second ring oscillator interconnected to the first ring oscillator, wherein the second ring oscillator is configured to operate at a second frequency that is the first frequency divided by an integer, wherein an output of the second ring oscillator is coupled to the phase frequency detector.

In certain embodiments of the PLL system, the first ring oscillator may include a first plurality of latches configured in a chain such that an input of each of the plurality of latches is an output of a different one of the first plurality of latches, and wherein the second ring oscillator may include a second plurality of latches configured in a chain such that an input of each of the second plurality of latches is an output of a different one of the second plurality of latches; the voltage-controlled oscillator may include a plurality of enable switches, wherein each of the second plurality of latches is coupled to a power supply through one of the plurality of enable switches, and wherein each of the plurality of enable switches is coupled to and toggled by an output of one of the first plurality of inverters; the voltage-controlled oscillator may include a stuck state eliminator circuit coupled to at least one element of the second ring oscillator, wherein the stuck state eliminator circuit is configured to correct an error in at least one element of the second ring oscillator, such as an error in an initialized state; at least one element of the second ring oscillator may include a latch with integrated stuck state elimination; the latch with integrated stuck state elimination may include a gated buffer followed by an inverter; the latch with integrated stuck state elimination may include an element with three inputs having a first input coupled to an output of a previous element of the second ring oscillator, a second input coupled to an output of an element of the second ring oscillator prior to the previous element, and a third input coupled to an inverted output of the first element of the second ring oscillator; and/or the voltage-controlled oscillator may include a third ring oscillator interconnected to the second ring oscillator, wherein the third ring oscillator is configured to operate at a third frequency that is the second frequency divided by an integer multiple, and wherein an output of the third ring oscillator is coupled to the phase frequency detector.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 2:
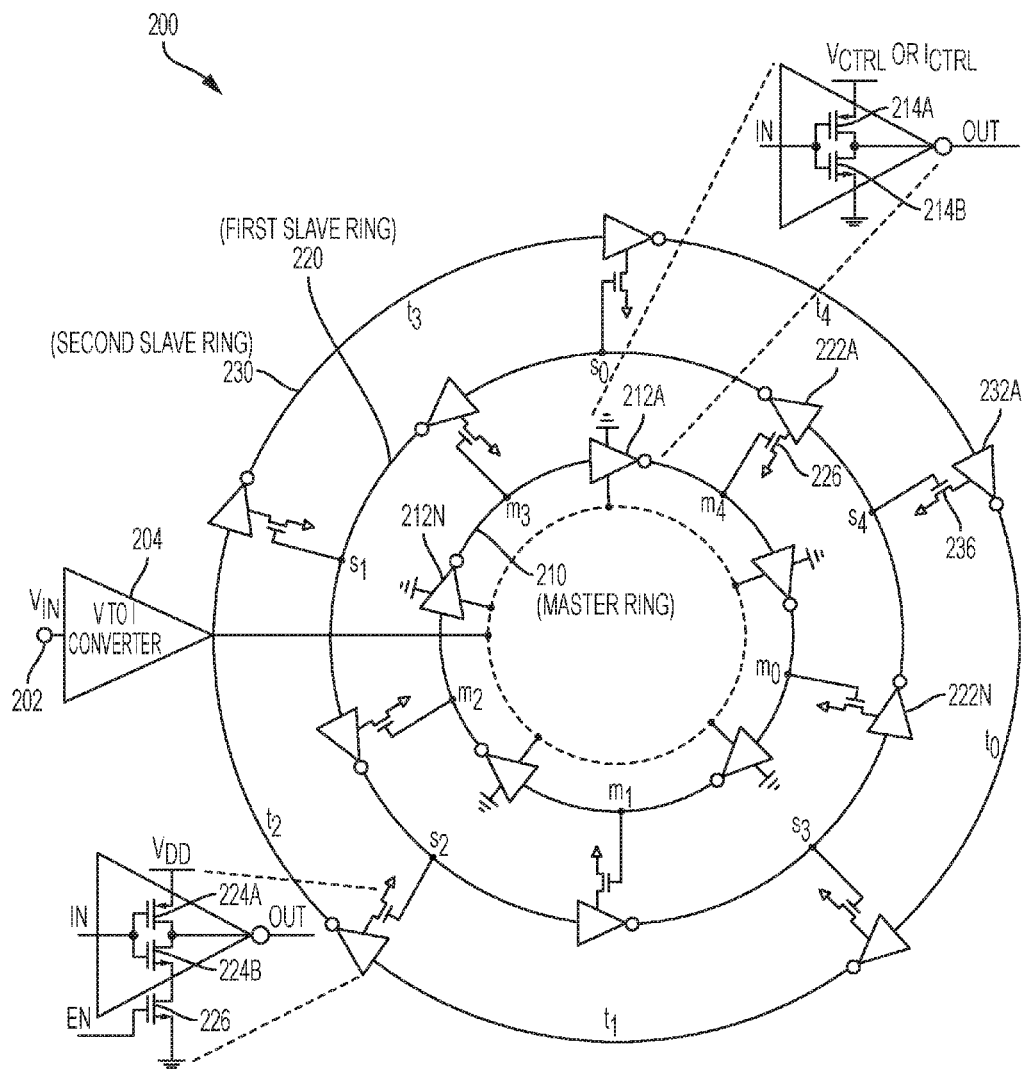
FIG. 2 is a circuit diagram illustrating a 5-stage ring divider with two slave rings according to one embodiment of the disclosure.

A divider that is suitable for ring oscillators with one or more outputs is provided by embodiments of the present disclosure. The rings of the oscillator may be described as a master ring that receives an input signal from an input node, and one or more slave rings that receive input from the master ring or other slave rings. The master-slave ring divider may implement a redundant numbering system. Example redundant numbering systems include, but are not limited to: 1) Carry-Save Adders; 2) Booth-Encoded Multipliers; and 3) Biquinary Numbering Systems. The master-slave ring divider may have inverting latches that form a (first) slave ring, with latch enables that are tied to the master ring oscillator outputs (e.g., $m_0$-$m_{N-1}$ as shown in FIG. 2). Example embodiments described herein include 5, 7, or 9 elements in a ring divider. However, any odd number of elements may be included in a ring. The direction of each ring may be opposite to the direction of the previous ring. This configuration results in only one transition in a slave ring for each N−1 transition in the previous ring (previous slave or master ring). For a large N value, the power saving for the slave ring(s) is improved due to the reduced frequency. Without loss of generality, a single-stage master-slave divider is described in more detail below, but the embodiments of the present disclosure are in no way limited to a single-stage master-slave divider and embodiments of the present disclosure can be extended to multiple slave stages.

Figure 1A:
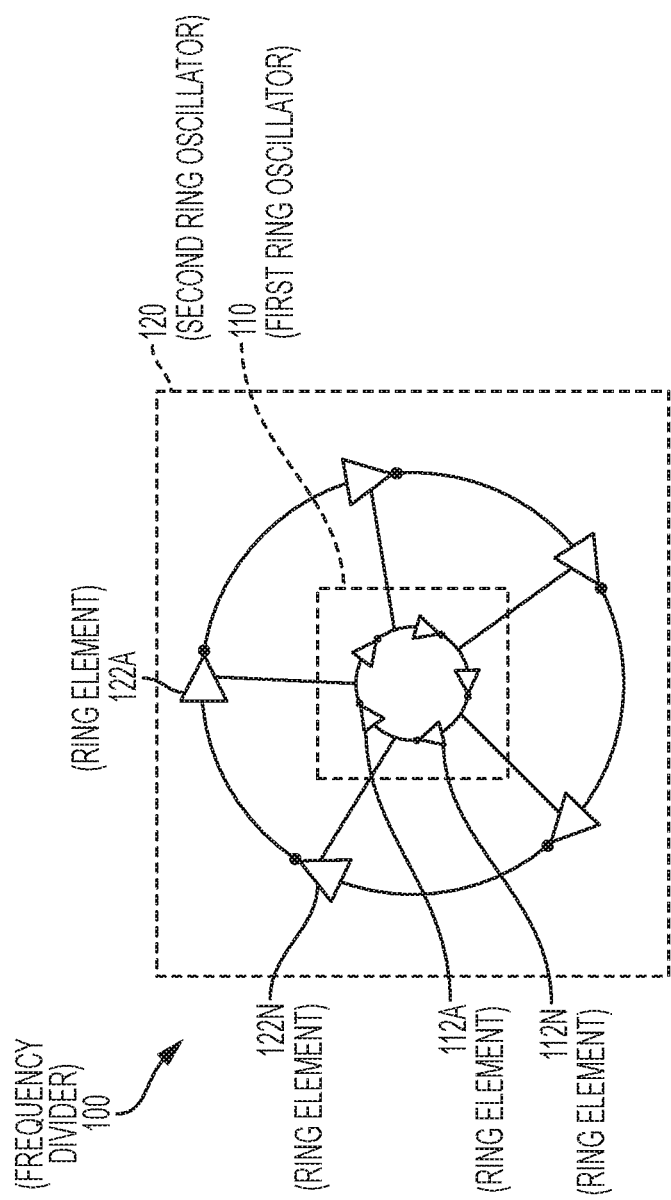
FIG. 1A is a circuit diagram illustrating a ring divider according to one embodiment of the disclosure.

FIG. 1A is a circuit diagram illustrating a ring divider according to one embodiment of the disclosure. A frequency divider 100 may include a first ring oscillator 110, or master ring, may include elements 112A to 112N, where N is an odd number, connected in a ring configuration such that an input of one element is the output of another element. A second ring oscillator 120, or slave ring, may include elements 122A to 122N, where N is an odd number and the same N as for the first ring oscillator 110, connected in a ring configuration such that an input of one element is the output of another element. Elements 122A to 122N of the second ring oscillator 120 may be coupled to outputs of the elements 112A to 112N of the first ring oscillator 110 to associate switching of elements 122A to 122N with elements 112A to 112N. In one embodiment, a power supply input node of the elements 122A to 122N may be driven by the outputs of elements 112A to 112N. In another embodiment, an enable switch coupled between the elements 122A to 122N and a fixed power supply rail may be controlled by outputs of elements 112A to 112N.

Figure 1B:
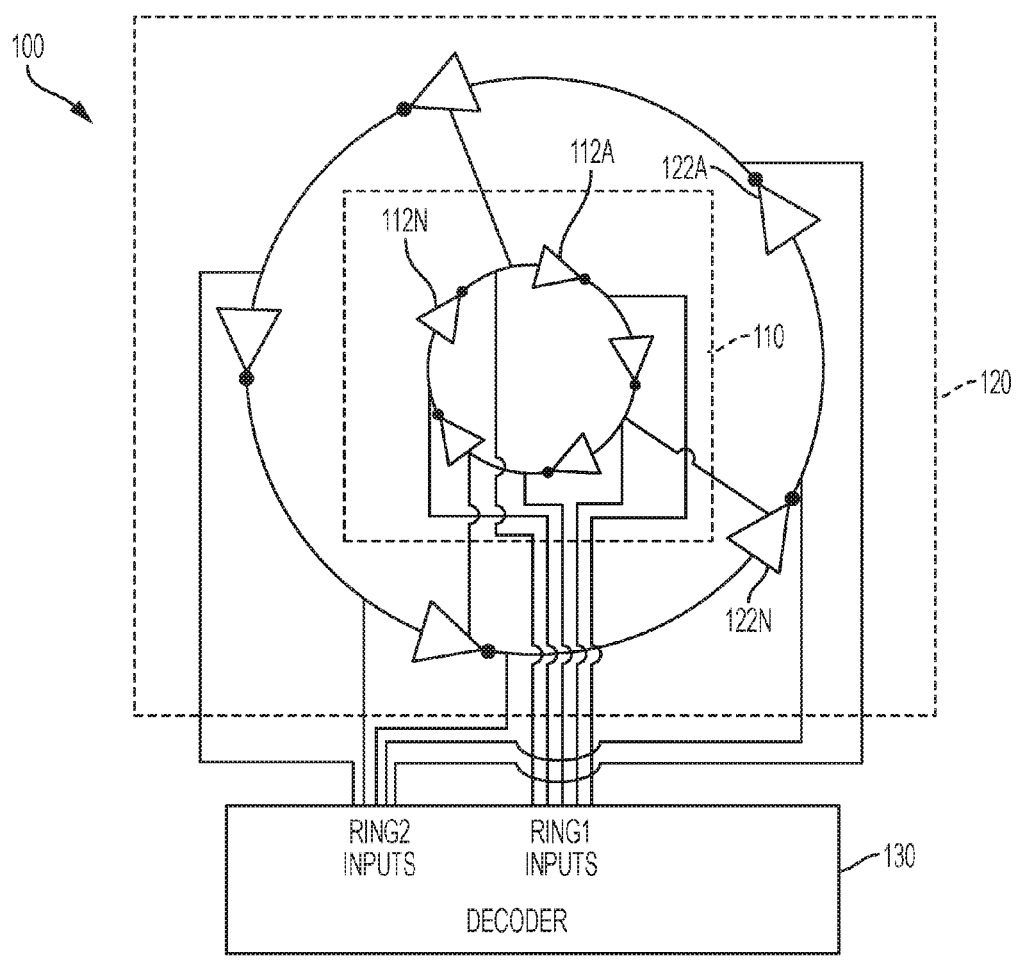
FIG. 1B is a circuit diagram illustrating a ring divider with decoder according to one embodiment of the disclosure.

The outputs of each of the elements 112A to 112N of the first ring oscillator 110 and elements 122A to 122N of the second ring oscillator 120 may be measured and decoded to provide a counter output. FIG. 1B is a circuit diagram illustrating a ring divider with decoder according to one embodiment of the disclosure. The ring oscillators 110 and 120 of FIG. 1B are similar to those of FIG. 1A. An output of each of the elements 112A to 112N and 122A to 122N may be coupled to decoder 130. The output of the elements may be a redundant numbering system, such as one of 1) Carry-Save Adders; 2) Booth-Encoded Multipliers; and 3) Biquinary Numbering Systems. The decoder 130 may be configured to convert the redundant numbering system output to a non-redundant numbering system. Embodiments of the decoder 130 are described in further detail below.

Although only two ring oscillators are shown in FIG. 1A and FIG. 1B, additional ring oscillators, or slave rings, may be coupled to the frequency divider to generate a lower frequency signal. FIG. 2 is a circuit diagram illustrating a 5-stage ring divider with two slave rings according to one embodiment of the disclosure. A frequency divider 200 may include a master ring 210 (e.g., first ring) driven by a variable supply (e.g., $V_{ctrl}$ or $I_{ctrl}$). The variable supply $V_{ctrl}$ or $I_{ctrl}$ may be controlled by V-to-I converter 204, which receives an input voltage $V_{in}$ at input node 202. The variable supply $V_{ctrl}$ or $I_{ctrl}$ may drive an odd-number of elements 212A to 212N. An output of each of the N elements of the master ring 210 may be denoted $m_0$ to $m_{N-1}$. The example shown in FIG. 2 is for a current-controlled oscillator (CCO) driven by an input voltage through the V-to-I converter 204. However, the oscillator may instead be driven as a voltage-controlled oscillator (VCO), such as by coupling the input node 202 to the master ring 210 without V-to-I converter 204.

The first and second slave rings 220 and 230 (e.g., second and third rings) may be driven by a fixed supply voltage $V_{DD}$. The fixed supply voltage $V_{DD}$ may drive an odd-number of elements 222A to 222N and 232A to 232N. The fixed supply voltage $V_{DD}$ may be gated by enable switches 226 that couple the elements 222A-N and 232A-N to the supply voltage $V_{DD}$. The enable switches 226 for each of the elements 222A-N may be toggled by the outputs $m_0$ to $m_{N-1}$ of the master ring 210. The outputs of each of the elements 222A-N may be denoted $s_0$ to $s_{N-1}$. Additional slave rings, such as second slave ring 230, may be attached to a previous slave ring, such as first slave ring 220, in a similar manner as the first slave ring 220 is coupled to the master ring 210. For example, the enable switches 236 for each of the elements 232A-N of the second ring 230 may be toggled by the outputs $s_0$ to $s_{N-1}$ of the first slave ring 220. One embodiment of an element of the slave rings 220 and 230 is shown including complimentary metal-oxide-semiconductor (CMOS) logic circuitry, such as transistors 224A and 224B coupled together and to fixed supply voltage $V_{DD}$ and the enable switch 236, respectively. Likewise, elements of the master ring 210 may include CMOS logic transistors 214A and 214B. In one embodiment, each of the enable switches 226 and/or 236 may include only n-channel metal-oxide-semiconductor (NMOS) logic circuitry. The benefit of NMOS-only enabled controls of the elements of slave rings is that the need for level shifting between two supply domains is eliminated.

Figure 3:
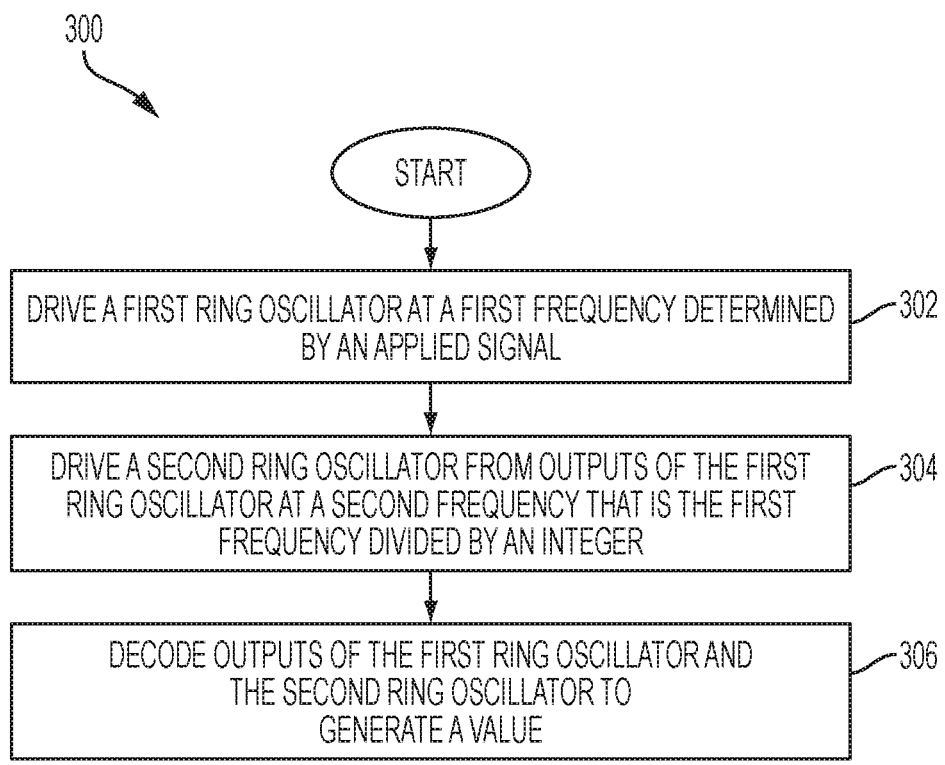
FIG. 3 is a flow chart illustrating a method of dividing a frequency using a ring divider according to one embodiment of the disclosure.

One method of operating embodiments of the frequency ring divider is shown in FIG. 3. FIG. 3 is a flow chart illustrating a method of dividing a frequency using a ring divider according to one embodiment of the disclosure. A method 300 may begin at block 302 with driving a first ring oscillator at a first frequency determined by an applied signal. The applied signal may be a voltage or a current, which may determine whether the first (or master) ring oscillator is a voltage-controlled oscillator (VCO) or a current-controlled oscillator (CCO).

At block 304, a second (or slave) ring oscillator may be driven from outputs of the first ring oscillator, wherein the second ring oscillator is driven at a second frequency that is equal to approximately the first frequency divided by an integer value N. The integer value N may correspond to the number of elements in the first ring oscillator and second ring oscillator. The second ring oscillator may be driven from the first ring oscillator when outputs of elements in the first ring oscillator change that subsequently toggles on and off elements in the second ring oscillator. In some embodiments, this driving of the second ring oscillator may be obtained by using the outputs of the elements of the first ring oscillator to toggle enable switches for the elements of the second ring oscillator.

During the driving of the first and second ring oscillators at blocks 302 and 304, the outputs of the elements from each ring may be monitored and decoded by a decoding circuit, such as may be part of an integrated circuit (IC). At block 306, the method 300 may include decoding outputs of the first ring oscillator and the second ring oscillator to generate a value. The value may be used to count a number of signal edges, and subsequently obtain a counter value or to generate an output signal with a frequency that is a divided value from the first frequency.

Figure 4:
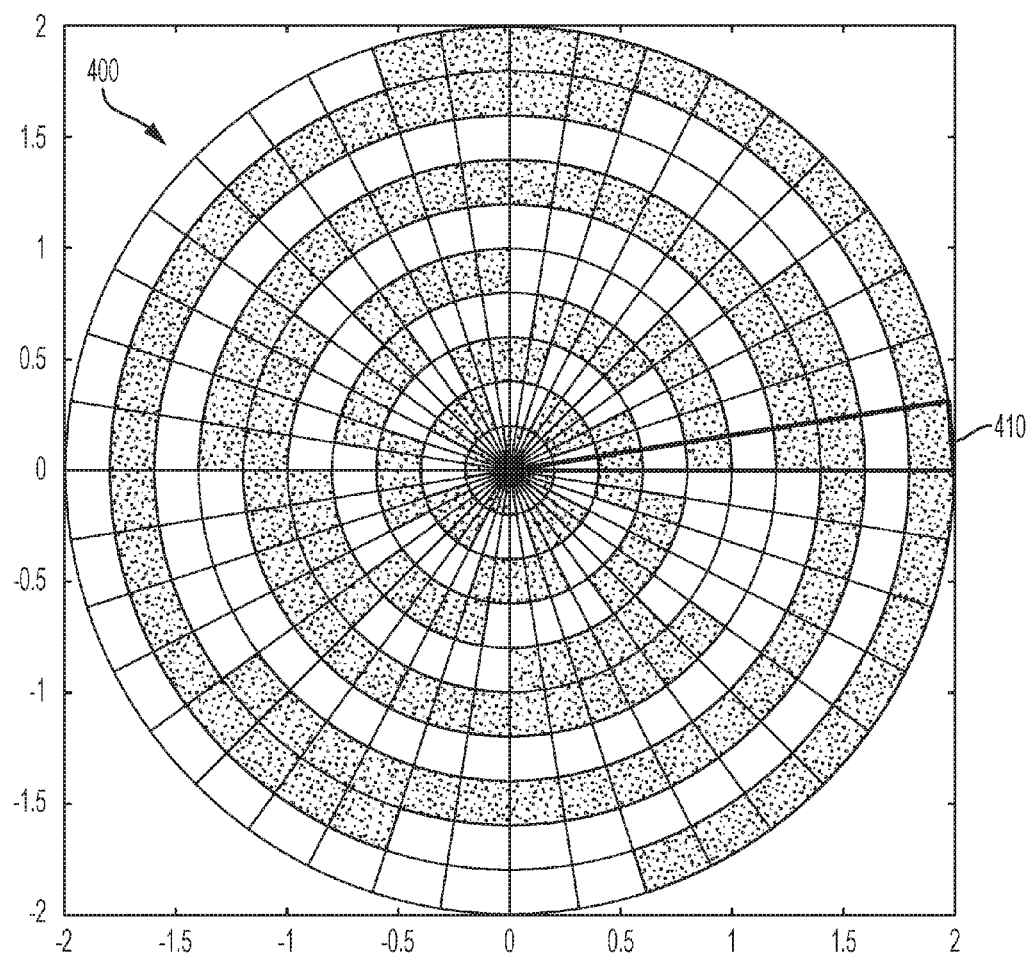
FIG. 4 is an output map of a 5-stage ring divider according to one embodiment of the disclosure.

To visualize the transitions in a single-slave master/slave frequency divider, an example output map is shown in FIG. 4, where N=5. FIG. 4 is an output map of a 5-stage ring divider according to one embodiment of the disclosure. Each radial slice from the map 400 of FIG. 4 represents one possible state which can be assigned a number and then detected by a decoder and output by the decoder, where black represents zeros and white represents ones. Taking a radial slice 410 of the output map 400, the inner N outputs (N=5) of the radial slice 410 (e.g., the N outputs closer to the ring center) belong to the master ring, and the outer N outputs (N=5) of the radial slice (e.g., the N outputs closer to the outer ring perimeter) belong to the slave ring. For illustration purposes, this example only shows one slave ring (or one stage of division), although additional stages may be included. One of the slave outputs transitions every fourth (e.g., N−1) transition of the master ring.

Figure 5:
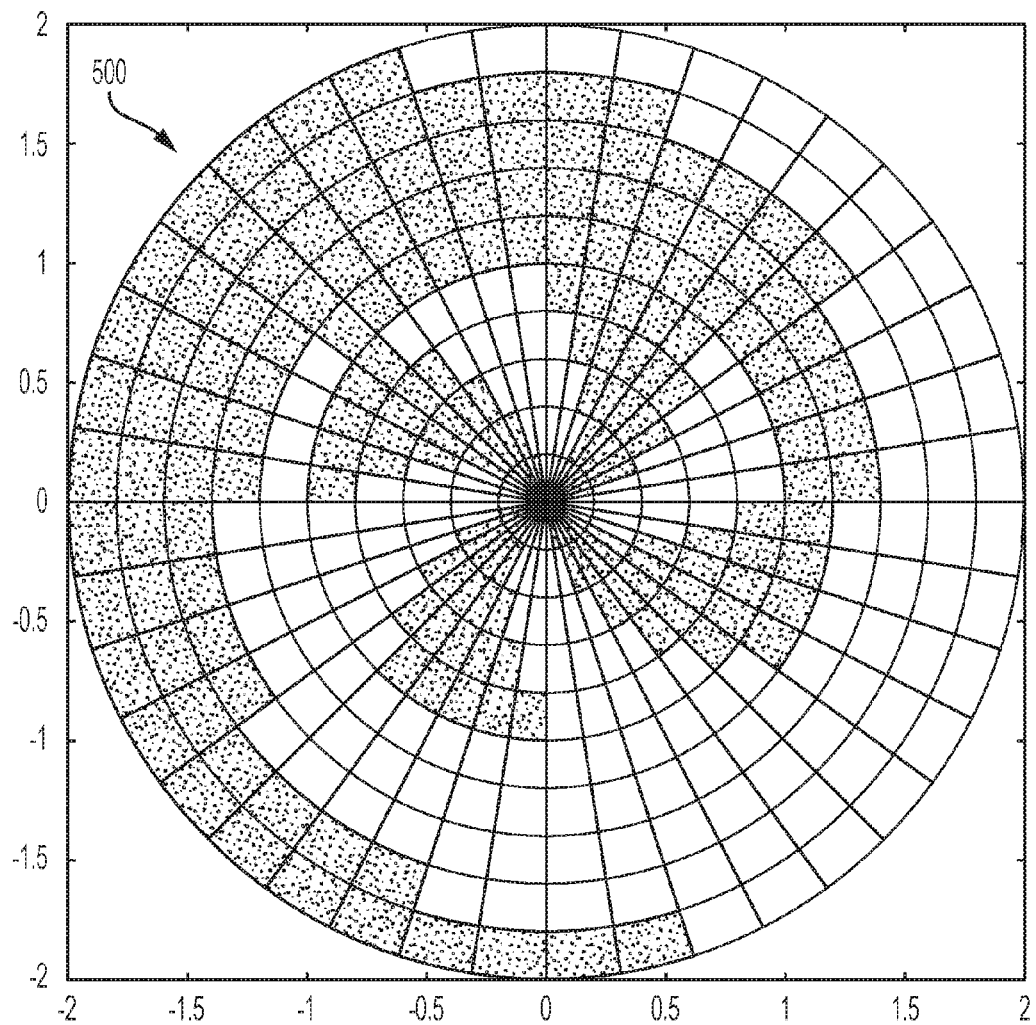
FIG. 5 is a result of a XOR operation of the output map of FIG. 4 with a set of alternating 1's and 0's according to one embodiment of the disclosure.

The output map of FIG. 4 may be XORed with an alternating pattern of ones and zeroes (e.g., 101 . . . 01) to obtain the map of FIG. 5. FIG. 5 is a result of a XOR operation of the output map of FIG. 4 with a set of alternating 1's and 0's according to one embodiment of the disclosure. In FIG. 4, the outputs and the states are differentiated, and FIG. 5 shows a map 500 of the result of the XOR operation.

The present disclosure also provides methods of using ring oscillator dividers, such as shown in FIG. 1A and FIG. 2, to implement low-power counters. The ambiguity problem discussed in the background with respect to prior art ring oscillator counters may be reduced or resolved by a master-slave ring divider that has at least a master ring and a slave ring (e.g., such as the master-slave divider shown in FIG. 1A and FIG. 2). For a large N value, the power savings for each subsequent slave ring is improved due to the reduced frequency. For a large N value, one slave divider ring may be sufficient for some applications. Other applications may include multiple rings, or multiple rings with smaller N values. The total number of states of a single slave ring divider-based counter is 2N(N−1). Each additional slave ring increases the range of the counter by a factor of N−1. One embodiment for decoding the states of the master/slave ring divider to obtain a count from 0 to 2N(N−1)−1 is described below with reference to FIG. 6.

Figure 6:
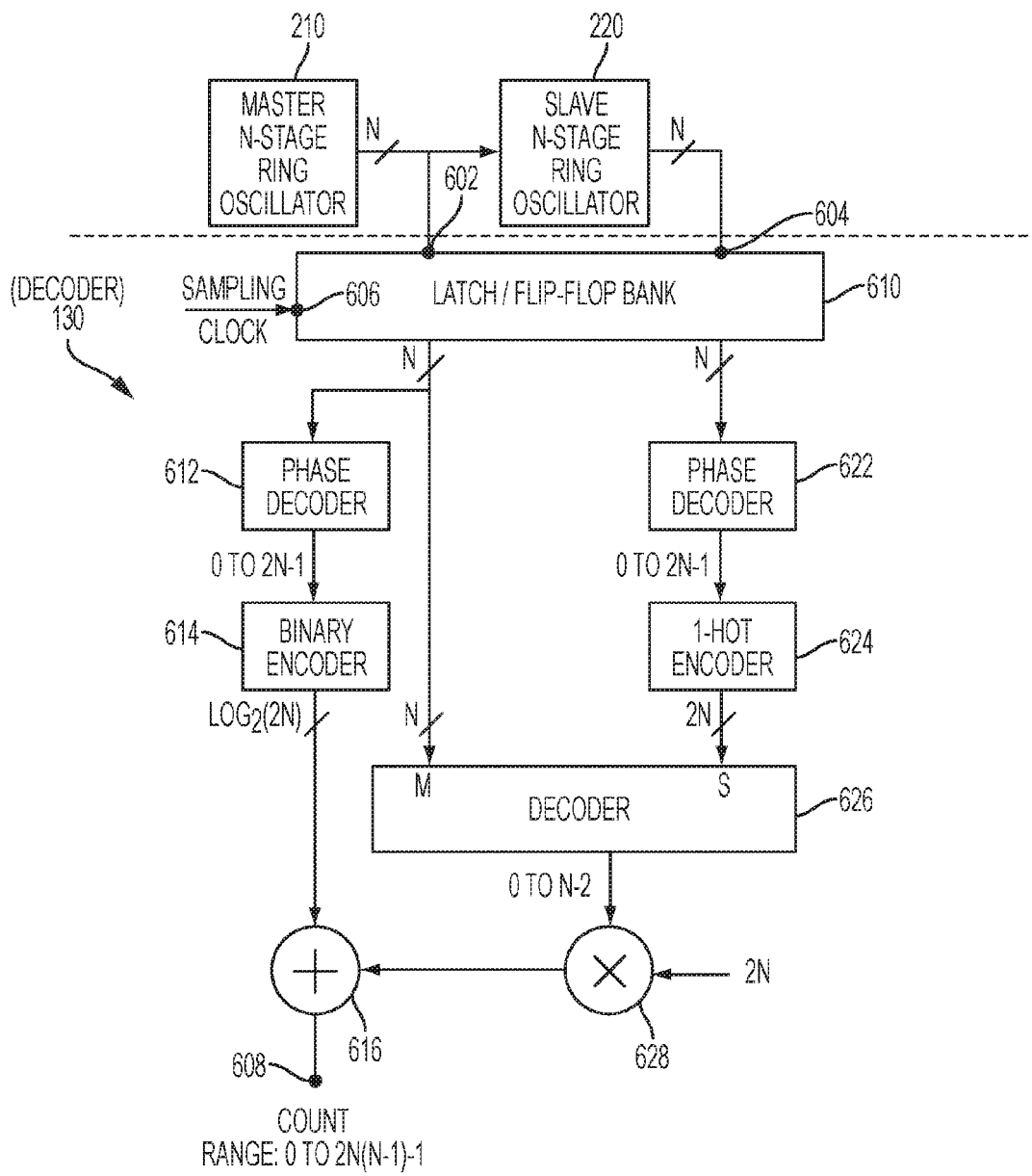
FIG. 6 is a block diagram illustrating a counter for a N-stage ring divider according to one embodiment of the disclosure.

The block diagram shown in FIG. 6 is one embodiment of a decoder 130 used to convert the outputs of the master/slave divider to a count. FIG. 6 is a block diagram illustrating a counter for a N-stage ring divider according to one embodiment of the disclosure. The N outputs of each ring are latched at latch bank 610 from input nodes 602 and 604 based on a sample clock and fed into phase decoders 612 and 622. The resulting decoded phase from phase decoders 612 and 622 may be 0 to 2N−1. For the master ring, the phase decoder 612 outputs a binary encoded output. For the slave ring, the output of phase decoder 622 is a one-hot output. Then, using the N outputs of the master ring from the latch bank 610 and the 2N outputs of decoded slave phase from one-hot encoder 624, a decoder 626 produces an output that ranges from 0 to N−2. This output represents the number of times the master ring wraps around. Multiplying, with multiplier 628, this output by 2N (the number of states in the master), and adding, at adder 616, the binary encoded master ring's phase from encoder 614, a count that ranges from 0 to 2N (N−1)−1 may be obtained.

One example truth table for a ring frequency divider with N=5 usable to generate counts from the output of the divider is shown in Table 1. The decoder 626 of FIG. 6 may implement decoding logic to perform decoding based on the table shown in Table 1.

TABLE 1

A truth table for a N = 5 stage master/slave ring divider according to one embodiment of the disclosure.

| Master | | | | | Slave | | | | | Decoded Master | Decoded Slave | Add 2N Multiple | Count |
|---|---|---|---|---|---|---|---|---|---|---|---|---|---|
| 0 | 1 | 2 | 3 | 4 | 0 | 1 | 2 | 3 | 4 | | | | |
| 1 | 0 | 0 | 0 | 0 | 1 | 0 | 0 | 0 | 0 | 0 | 0 | 0 | 0 |
| 1 | 1 | 0 | 0 | 0 | 1 | 0 | 0 | 0 | 0 | 1 | | | 1 |
| 1 | 1 | 1 | 0 | 0 | 1 | 0 | 0 | 0 | 0 | 2 | | | 2 |
| 1 | 1 | 1 | 1 | 0 | 1 | 0 | 0 | 0 | 0 | 3 | | | 3 |
| 1 | 1 | 1 | 1 | 1 | 1 | 1 | 0 | 0 | 0 | 4 | 1 | | 4 |
| 0 | 1 | 1 | 1 | 1 | 1 | 1 | 0 | 0 | 0 | 5 | | | 5 |
| 0 | 0 | 1 | 1 | 1 | 1 | 1 | 0 | 0 | 0 | 6 | | | 6 |
| 0 | 0 | 0 | 1 | 1 | 1 | 1 | 0 | 0 | 0 | 7 | | | 7 |
| 0 | 0 | 0 | 0 | 1 | 1 | 1 | 1 | 0 | 0 | 8 | 2 | | 8 |
| 0 | 0 | 0 | 0 | 0 | 1 | 1 | 1 | 0 | 0 | 9 | | | 9 |
| 1 | 0 | 0 | 0 | 0 | 1 | 1 | 1 | 0 | 0 | 0 | | 1 | 10 |
| 1 | 1 | 0 | 0 | 0 | 1 | 1 | 1 | 0 | 0 | 1 | | | 11 |
| 1 | 1 | 1 | 0 | 0 | 1 | 1 | 1 | 1 | 0 | 2 | 3 | | 12 |
| 1 | 1 | 1 | 1 | 0 | 1 | 1 | 1 | 1 | 0 | 3 | | | 13 |
| 1 | 1 | 1 | 1 | 1 | 1 | 1 | 1 | 1 | 0 | 4 | | | 14 |
| 0 | 1 | 1 | 1 | 1 | 1 | 1 | 1 | 1 | 0 | 5 | | | 15 |
| 0 | 0 | 1 | 1 | 1 | 1 | 1 | 1 | 1 | 1 | 6 | 4 | | 16 |
| 0 | 0 | 0 | 1 | 1 | 1 | 1 | 1 | 1 | 1 | 7 | | | 17 |
| 0 | 0 | 0 | 0 | 1 | 1 | 1 | 1 | 1 | 1 | 8 | | | 18 |
| 0 | 0 | 0 | 0 | 0 | 1 | 1 | 1 | 1 | 1 | 9 | | | 19 |
| 1 | 0 | 0 | 0 | 0 | 0 | 1 | 1 | 1 | 1 | 0 | 5 | 2 | 20 |
| 1 | 1 | 0 | 0 | 0 | 0 | 1 | 1 | 1 | 1 | 1 | | | 21 |
| 1 | 1 | 1 | 0 | 0 | 0 | 1 | 1 | 1 | 1 | 2 | | | 22 |
| 1 | 1 | 1 | 1 | 0 | 0 | 1 | 1 | 1 | 1 | 3 | | | 23 |
| 1 | 1 | 1 | 1 | 1 | 0 | 0 | 1 | 1 | 1 | 4 | 6 | | 24 |
| 0 | 1 | 1 | 1 | 1 | 0 | 0 | 1 | 1 | 1 | 5 | | | 25 |

TABLE 1-continued

A truth table for a N = 5 stage master/slave ring divider according to one embodiment of the disclosure.

| Master | | | | | Slave | | | | | Decoded Master | Decoded Slave | Add 2N Multiple | Count |
|---|---|---|---|---|---|---|---|---|---|---|---|---|---|
| 0 | 0 | 1 | 1 | 1 | 0 | 0 | 1 | 1 | 1 | 6 | | | 26 |
| 0 | 0 | 0 | 1 | 1 | 0 | 0 | 1 | 1 | 1 | 7 | | | 27 |
| 0 | 0 | 0 | 0 | 1 | 0 | 0 | 0 | 1 | 1 | 8 | 7 | | 28 |
| 0 | 0 | 0 | 0 | 0 | 0 | 0 | 0 | 1 | 1 | 9 | | | 29 |
| 1 | 0 | 0 | 0 | 0 | 0 | 0 | 0 | 1 | 1 | 0 | | 3 | 30 |
| 1 | 1 | 0 | 0 | 0 | 0 | 0 | 1 | 1 | 1 | 1 | | | 31 |
| 1 | 1 | 1 | 0 | 0 | 0 | 0 | 0 | 0 | 1 | 2 | 8 | | 32 |
| 1 | 1 | 1 | 1 | 0 | 0 | 0 | 0 | 0 | 1 | 3 | | | 33 |
| 1 | 1 | 1 | 1 | 1 | 0 | 0 | 0 | 0 | 1 | 4 | | | 34 |
| 0 | 1 | 1 | 1 | 1 | 0 | 0 | 0 | 0 | 1 | 5 | | | 35 |
| 0 | 0 | 1 | 1 | 1 | 0 | 0 | 0 | 0 | 0 | 6 | 9 | | 36 |
| 0 | 0 | 0 | 1 | 1 | 0 | 0 | 0 | 0 | 0 | 7 | | | 37 |
| 0 | 0 | 0 | 0 | 1 | 0 | 0 | 0 | 0 | 0 | 8 | | | 38 |
| 0 | 0 | 0 | 0 | 0 | 0 | 0 | 0 | 0 | 0 | 9 | | | 39 |

Figure 7:
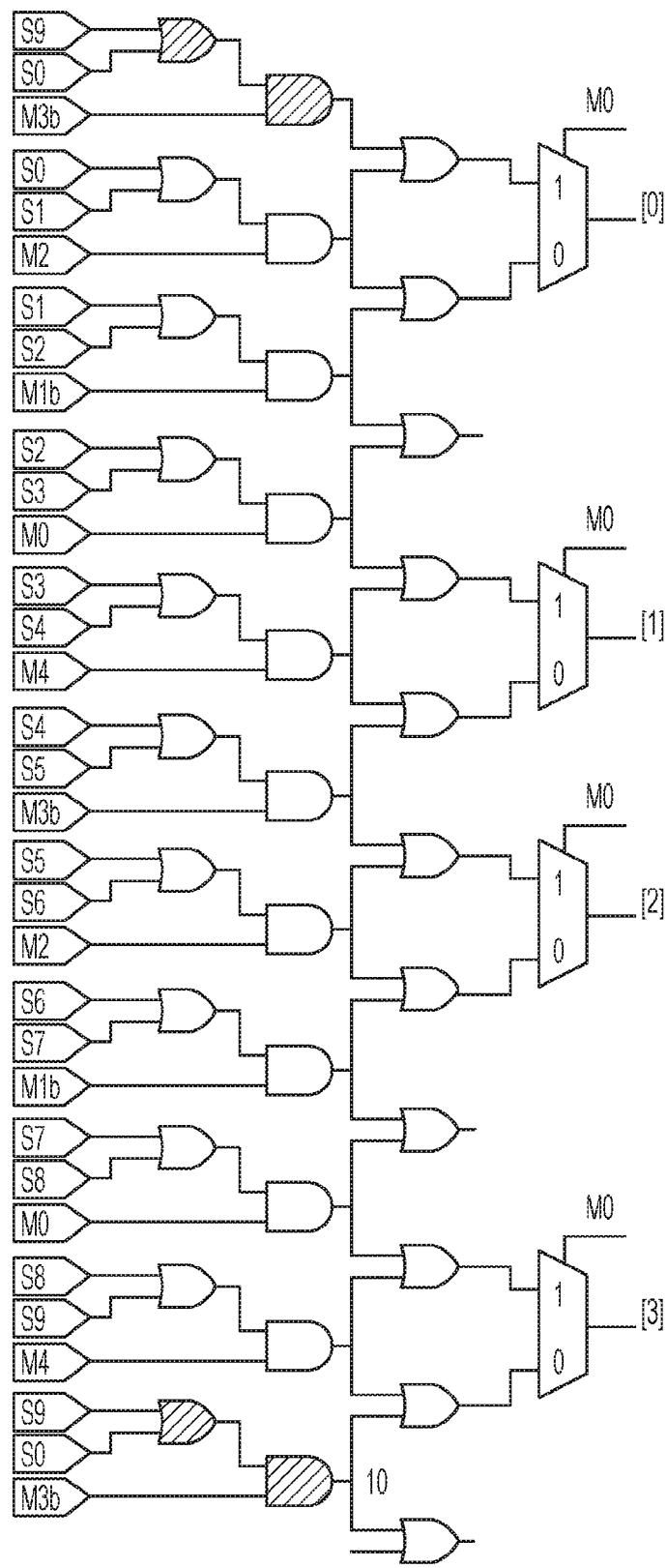
FIG. 7 is a circuit diagram illustrating a decoder for an N-stage ring divider, as may be used in the counter of FIG. 6, according to one embodiment of the disclosure.

One example embodiment of a gate-level schematic for the decoder 626 for decoding a ring frequency divider with N=5 is shown in FIG. 7. FIG. 7 is a circuit diagram illustrating a decoder for an N-stage ring divider, as may be used in the counter of FIG. 6, according to one embodiment of the disclosure. In some embodiments, some of the circuits in FIG. 7 may be reused for other computations or functions on an integrated circuit (IC). The outputs of the circuit shown in FIG. 6 may be converted to binary before being multiplied by 2N. Alternatively, the one-hot code may be converted to 2N multiples directly using combinational logic.

Figure 8:
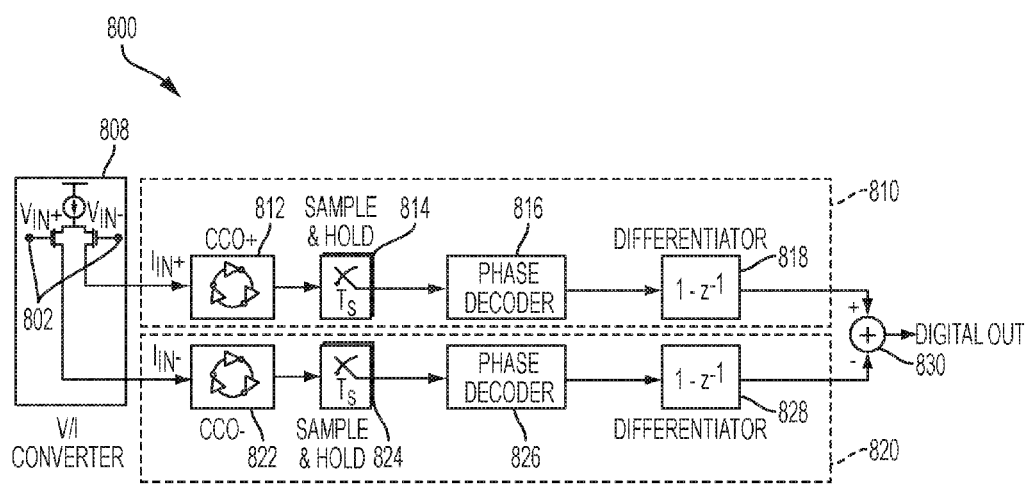
FIG. 8 is a block diagram illustrating a current-controlled oscillator (CCO)-based quantizer implemented with a ring divider according to one embodiment of the disclosure.

One example embodiment for a ring frequency divider according to the embodiments described herein is in a current-controlled oscillator (CCO)-based quantizer as shown in FIG. 8. FIG. 8 is a block diagram illustrating a current-controlled oscillator (CCO)-based quantizer implemented with a ring divider according to one embodiment of the disclosure. A quantizer 800, which may be used as an analog-to-digital converter (ADC), may include a differential input node 802 at a V-to-I converter 808. The differential input is provided to two processing paths 810 and 820. Each of the processing paths 810 and 820 may include a current-controlled oscillator (CCO) 812 and 822, a sample & hold circuit 814 and 824, a phase decoder 816 and 826, and a differentiator 818 and 828, respectively. The outputs of the two processing paths 810 and 820 may be summed at summer 830 to produce a digital signal at output node 804. Thus, an analog signal received at input nodes 802 is converted to a digital signal at output node 804. Each of the current-controlled oscillators (CCOs) 812 and 822 may be ring frequency dividers, such as described with reference to FIG. 1A and other embodiments herein. Although the ADC 800 is illustrated as processing a differential signal, the ADC 800 may also be configured to process a non-differential input.

Figure 9:
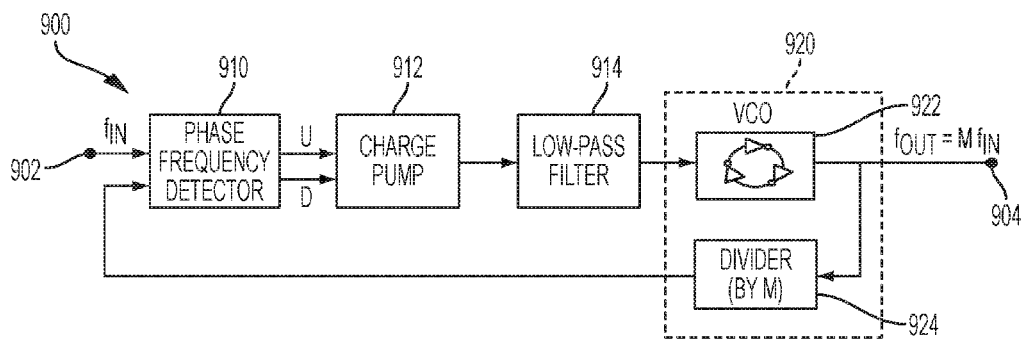
FIG. 9 is a block diagram illustrating a voltage-controlled oscillator (VCO)-based phase-locked loop (PLL) implemented with a ring divider according to one embodiment of the disclosure.

Another example embodiment for a ring frequency divider is in a phase-locked loop (PLL) system as shown in FIG. 9. Because there is a divide ratio of 1/(N−1) from the master ring to the slave ring, embodiments of a master-slave ring divider described herein may be used in applications where a VCO and a divider is required. An example of this requirement is in a phase-locked loop (PLL) as shown in FIG. 9. FIG. 9 is a block diagram illustrating a voltage-controlled oscillator (VCO)-based phase-locked loop (PLL) implemented with a ring divider according to one embodiment of the disclosure. A PLL system 900 may receive an input signal having a first frequency at input node 902. The input signal may be processed in phase frequency detector 910, then processed in charge pump 912, then processed in low-pass filter 914, and then processed in voltage-controlled oscillator 920. An output of the voltage-controlled oscillator 920 may be an output signal of a second frequency that is an integer division of the input frequency at output node 904. The voltage-controlled oscillator (VCO) 920 may be a ring frequency divider, such as described with reference to FIG. 1A and other embodiments herein. The VCO 920 may include a master ring 922 and a slave ring 924, wherein the slave ring 924 divides the frequency of the master ring 922 to obtain a divided frequency. The slave ring 924 may be a first, second, third, fourth, etc. slave ring depending on the desired output frequency.

Figure 10:
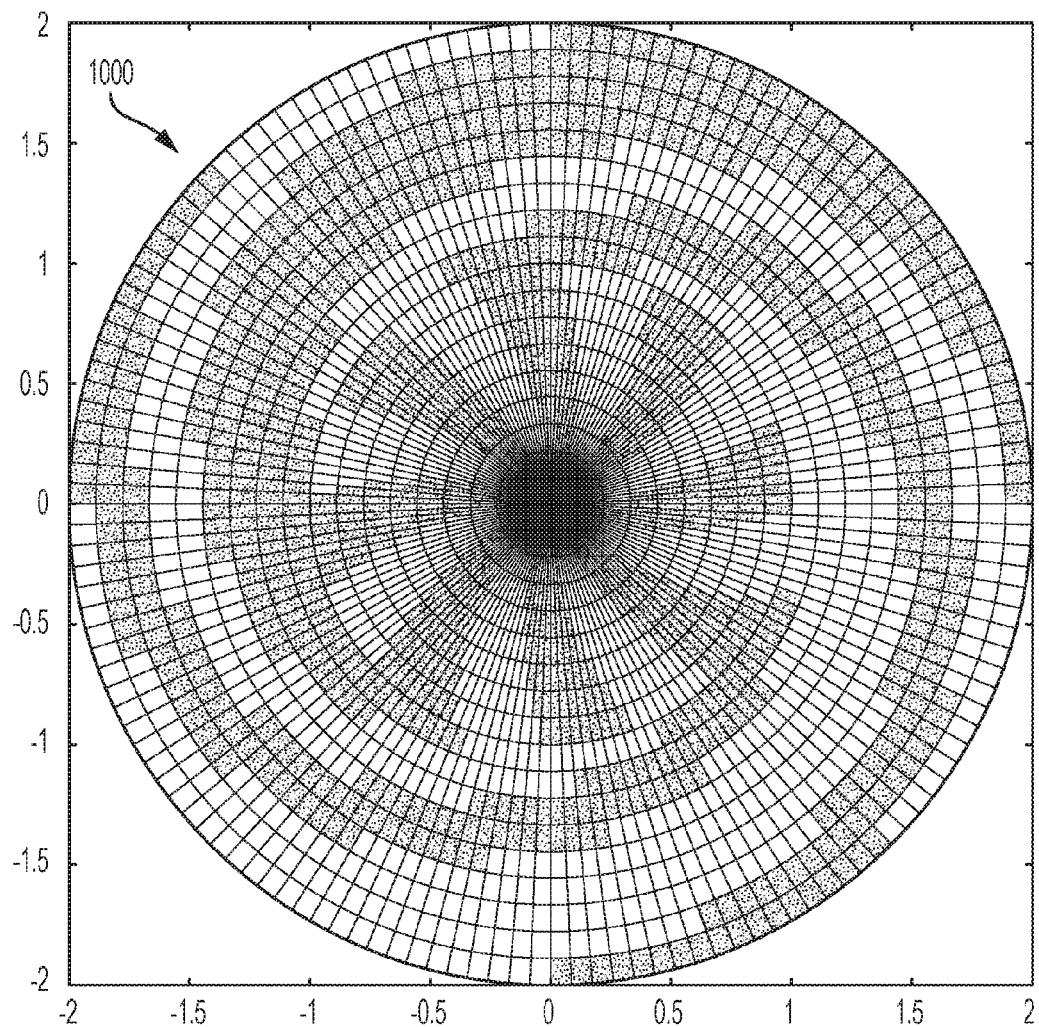
FIG. 10 is an output map of a 9-stage ring divider with a bad initial state according to one embodiment of the disclosure.
Figure 11:
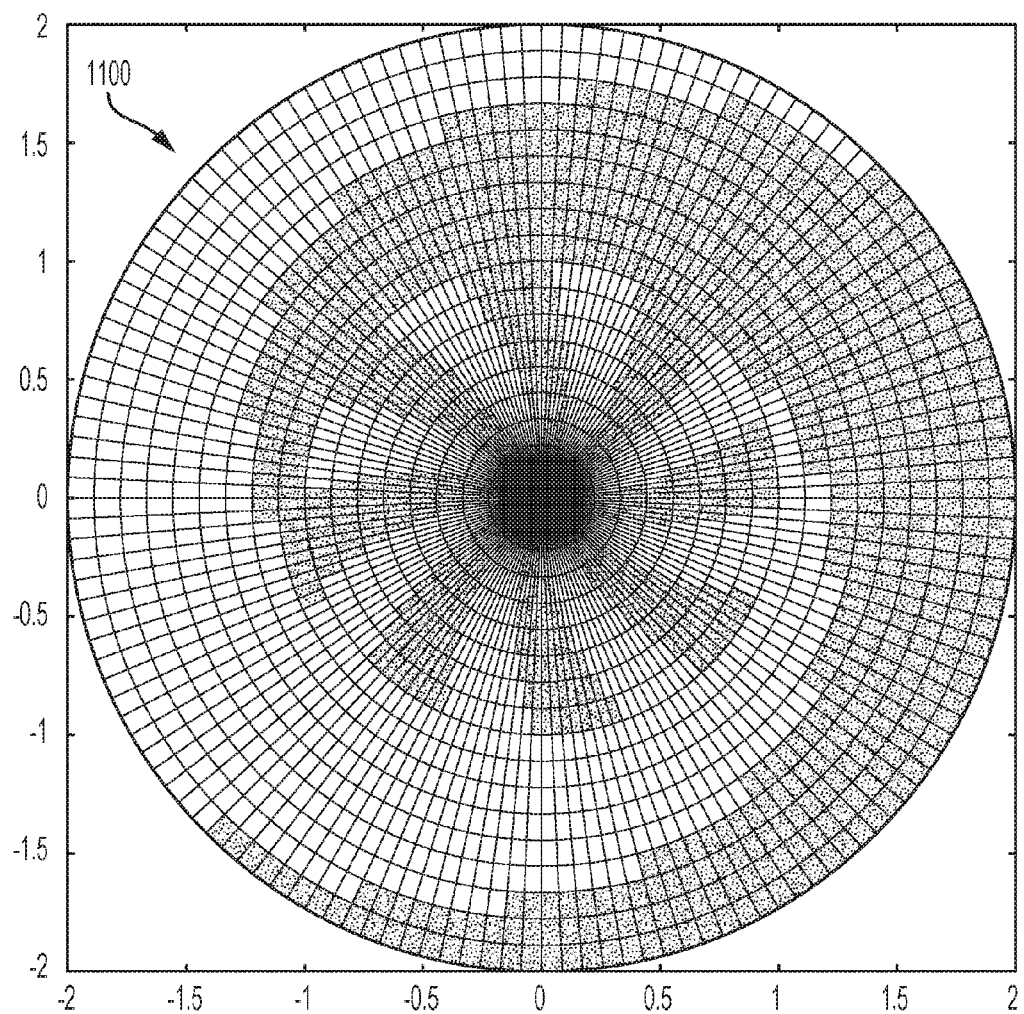
FIG. 11 is an output map of a 9-stage ring divider with no bad initial state according to one embodiment of the disclosure.

The above disclosure generally focused on an example master-slave ring divider where N=5. However, for master-slave ring dividers where N>5, there is a chance that the divider ring may be initialized to values that result in extra narrow-width pulses (even in steady-state) or a stuck state. FIG. 10 shows an example of this problem. FIG. 10 is an output map 1000 of a 9-stage ring divider with a bad initial state according to one embodiment of the disclosure. FIG. 10 shows a state map for a master/slave ring-divider where N=9. If there are bad initial states, FIG. 10 shows that extra edges or short pulses can result. The ideal state map is shown in FIG. 11. FIG. 11 is an output map 1100 of a 9-stage ring divider with no bad initial state according to one embodiment of the disclosure.

To remedy the problem of bad initial states, the slave ring may be configured to eliminate pulses that are shorter than half of the ring. This elimination of bad initial states may be achieved by gating at least one of the elements (e.g., latches) in the slave ring with a feed-forward combinational logic that ensures N/2 previous odd stages have the same outputs. In some embodiments, this combinational logic may implement a runt-pulse eliminator or other stuck state eliminator. Although stuck states and bad initial states are described herein, the stuck state eliminator circuits described herein may correct other errors within the ring divider that may be corrected with combinational logic or other circuitry coupled in or to the ring divider.

Figure 12:
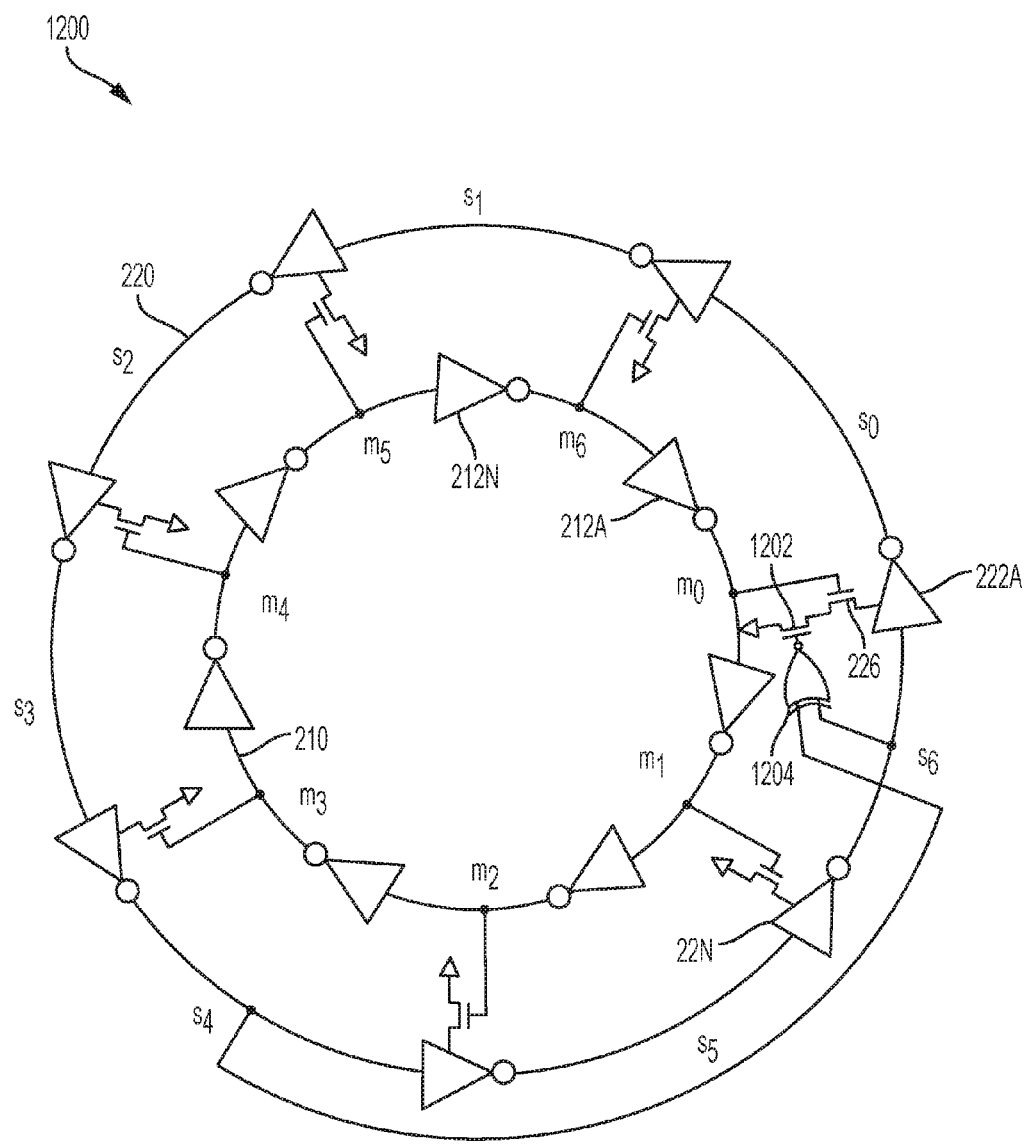
FIG. 12 is a circuit diagram illustrating a 5-stage ring divider with a stuck state eliminator according to one embodiment of the disclosure.

FIG. 12 shows an example of the use of such a stuck state eliminator for a master-slave ring divider where N=7. FIG. 12 is a circuit diagram illustrating a 5-stage ring divider with a stuck state eliminator according to one embodiment of the disclosure. A ring divider 1200 may include combinatorial logic having XOR gate 1204 configured to toggle an enable switch 1202 coupled in series with the enable switch 226. Inputs to the XOR gate 1204 may be the outputs from two previous elements of the slave ring, such as the $s_6$ and $s_4$ outputs. Although two particular outputs are provided to the XOR gate 1204, another suitable pair of inputs may be the $s_4$ and $s_2$ outputs, or other combinations of outputs. Further, different arrangements of combinatorial logic may be used other than the XOR gate 1204, and those arrangements may have different inputs.

Figure 13:
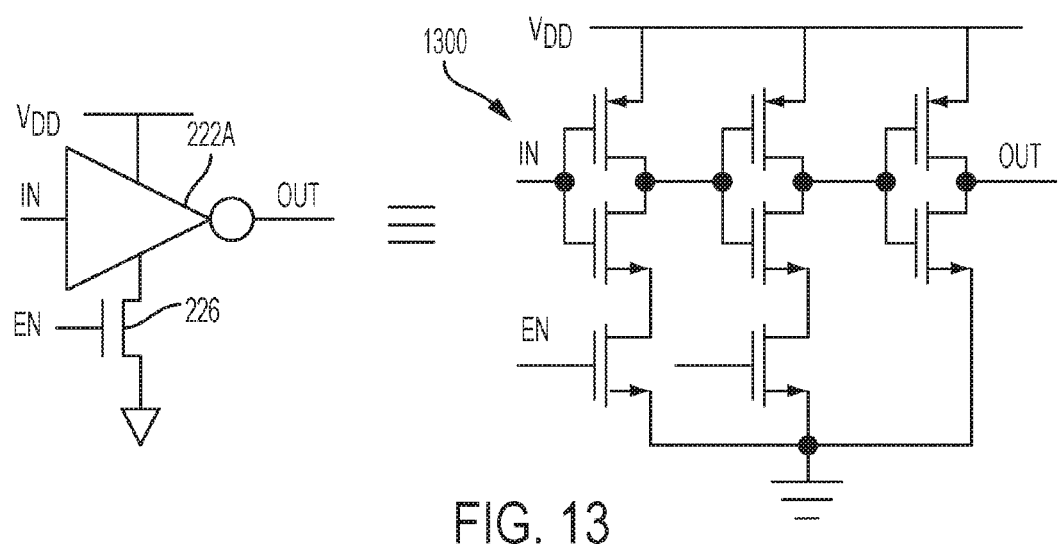
FIG. 13 is a circuit diagram illustrating an inverting element for a ring divider according to one embodiment of the disclosure.
Figure 14:
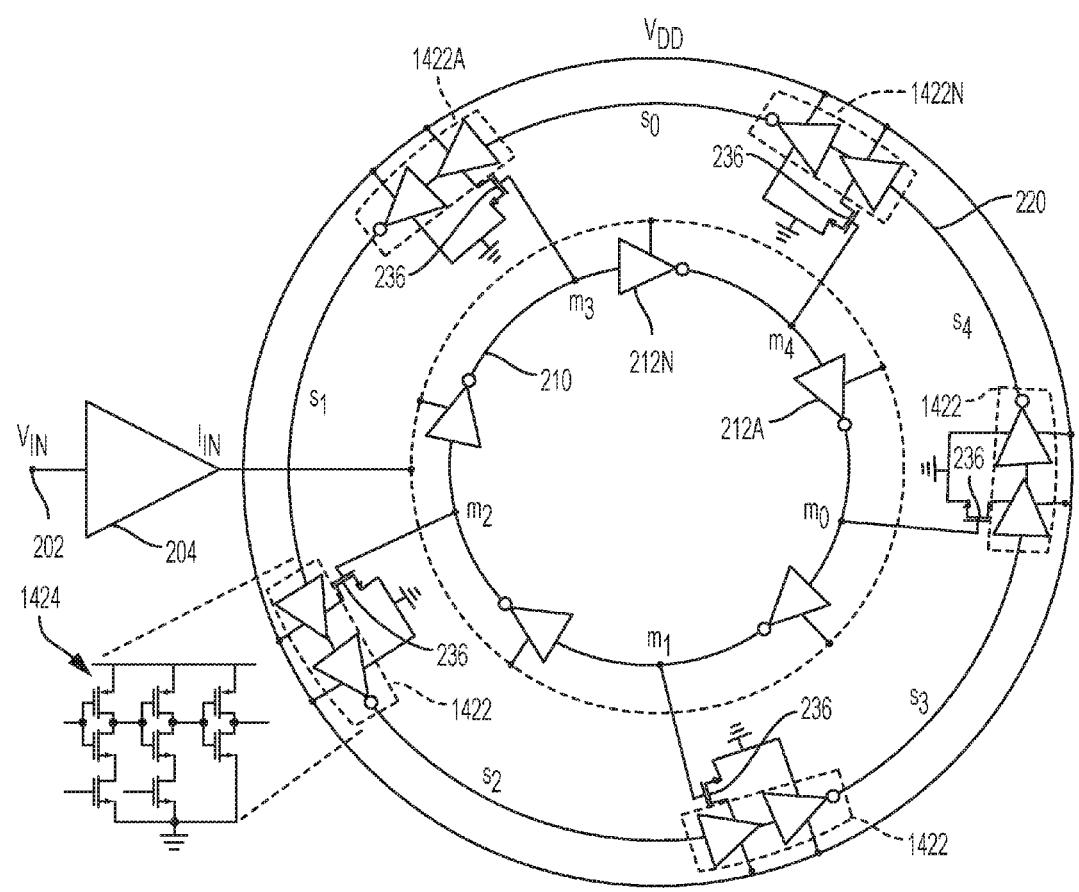
FIG. 14 is a circuit diagram illustrating a 5-stage ring divider with an improved inverting element according to one embodiment of the disclosure.

To improve the circuit performance of the ring divider, the NMOS-gated inverter may be replaced with a gated buffer followed by an inverter as shown in FIG. 13. FIG. 13 is a circuit 1300 diagram illustrating an inverting element for a ring divider according to one embodiment of the disclosure. The NMOS-gated buffer may include a latch that is configured to be enabled when input signal en is high or "1." The additional inverter may be sized to have adequate drive strength for driving subsequent logic stages. Thus, the circuit 1300 may reduce or remove race conditions by utilizing a latch, may reduce load on the enable input node en by small sizing, and may provide adequate drive for the slave ring outputs. Two such stages in the master-slave divider may implement a master-slave flip-flop. FIG. 14 shows an N=5 stage master-slave divider using the circuit 1300. FIG. 14 is a circuit diagram illustrating a 5-stage ring divider with an improved inverting element according to one embodiment of the disclosure. The gated buffer followed by an inverter of circuit 1300 is shown as elements 1422A-N on the second ring 220 with structure 1424.

Figure 15:
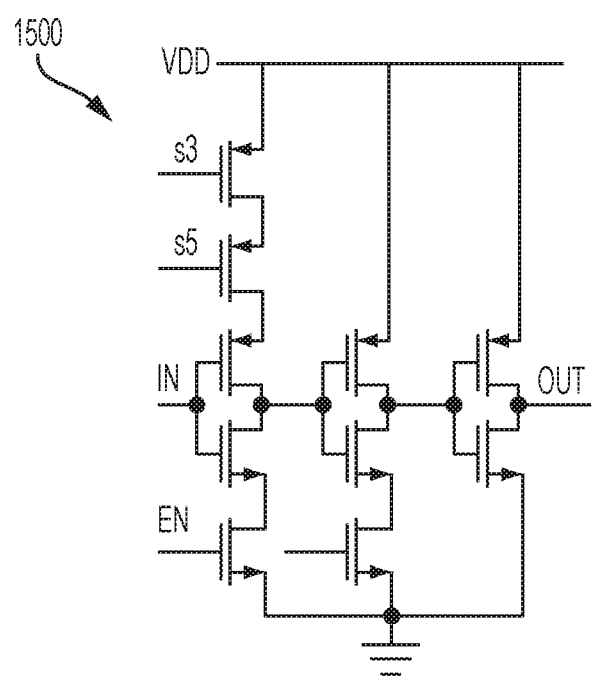
FIG. 15 is a circuit diagram illustrating an inverting element for a ring divider with stuck state elimination according to one embodiment of the disclosure.
Figure 16:
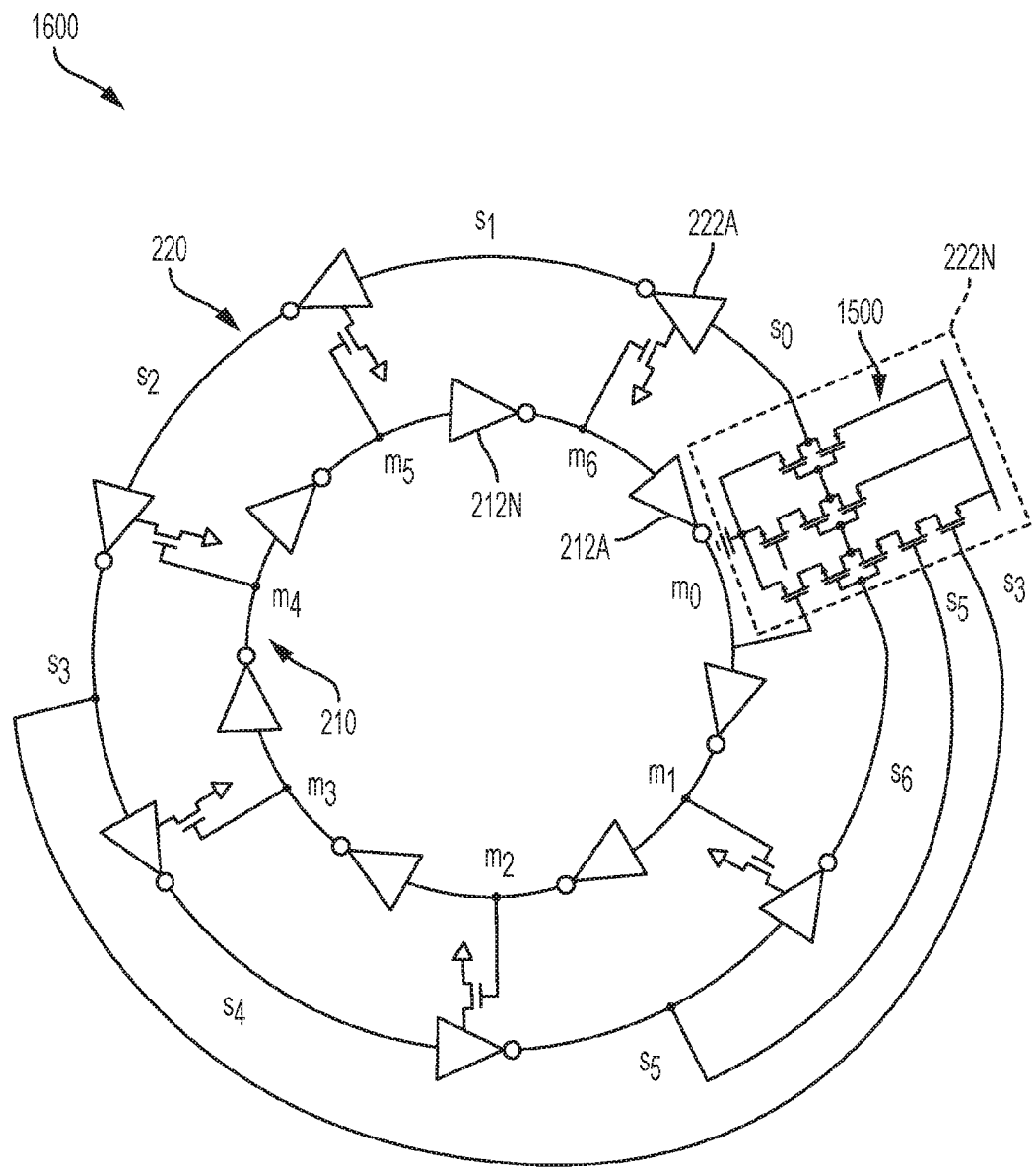
FIG. 16 is a circuit diagram illustrating a 7-stage ring divider with improved stuck state elimination according to one embodiment of the disclosure.

Another embodiment of a circuit for eliminating stuck states is shown in FIG. 15. In, for example, a master-slave divider for N=7 stages, at least one inverting delay element may be substituted with one similar to the circuit shown in FIG. 15, which may be used as combinatorial logic that operates to eliminate stuck states (or other errors) based on outputs from previous elements in the ring. FIG. 15 is a circuit 1500 diagram illustrating an inverting element for a ring divider with stuck state elimination according to one embodiment of the disclosure. In one embodiment of a 7-stage ring divider using the circuit 1500 for one element, the ring divider may be similar to that shown in FIG. 16. FIG. 16 is a circuit diagram illustrating a 7-stage ring divider with improved stuck state elimination according to one embodiment of the disclosure. A ring divider 1600 may include the circuit 1500 substituted for element 222N of the slave ring 220.

Figure 17A:
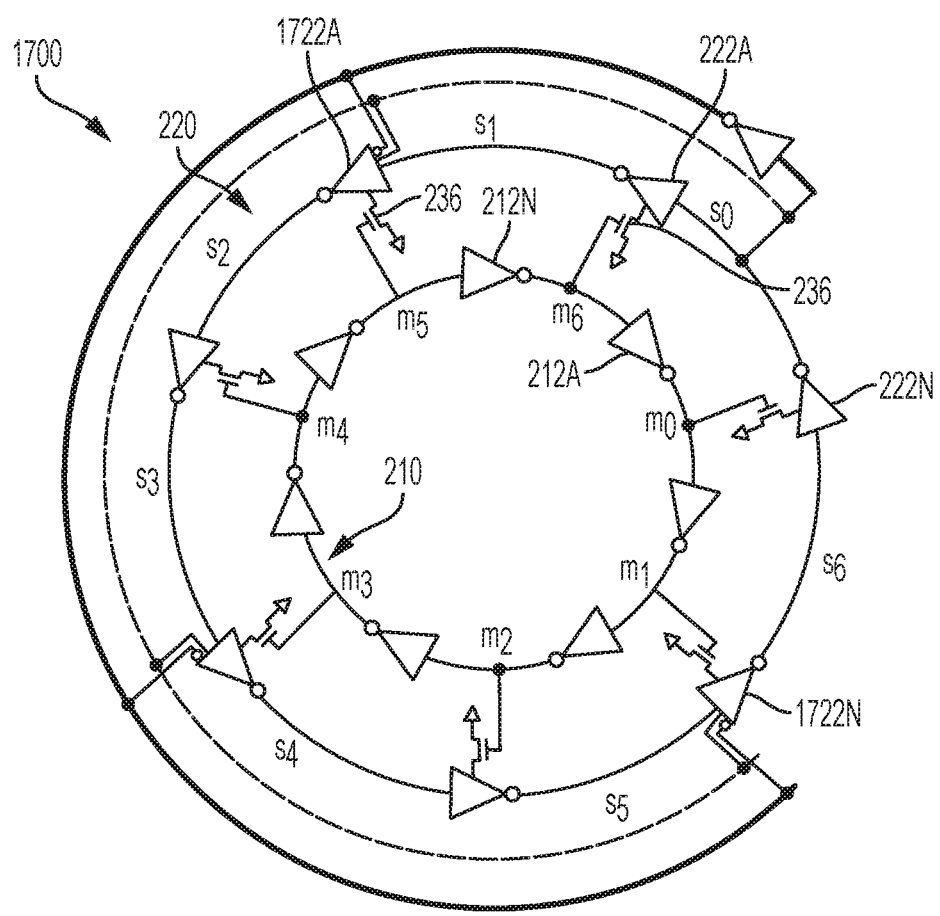
FIG. 17A is a circuit diagram illustrating a 7-stage ring divider with improved suck state elimination according to another embodiment of the disclosure.
Figure 17B:
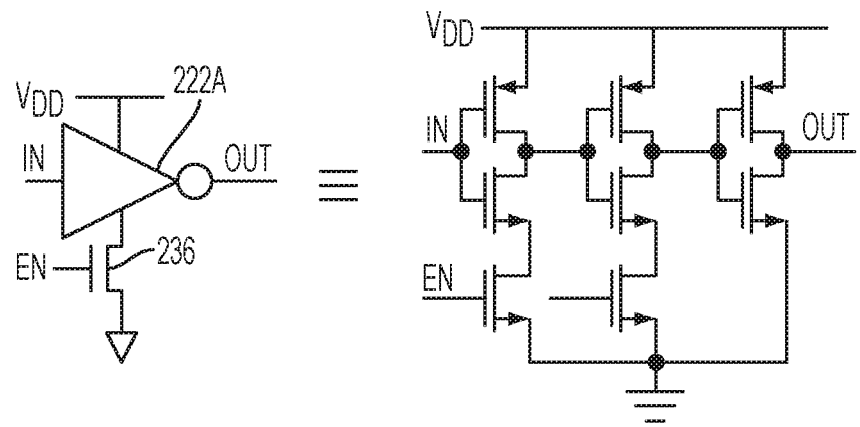
FIG. 17B is a circuit diagram illustrating an inverting element for some elements of the ring divider of FIG. 17A according to one embodiment of the disclosure.
Figure 17C:
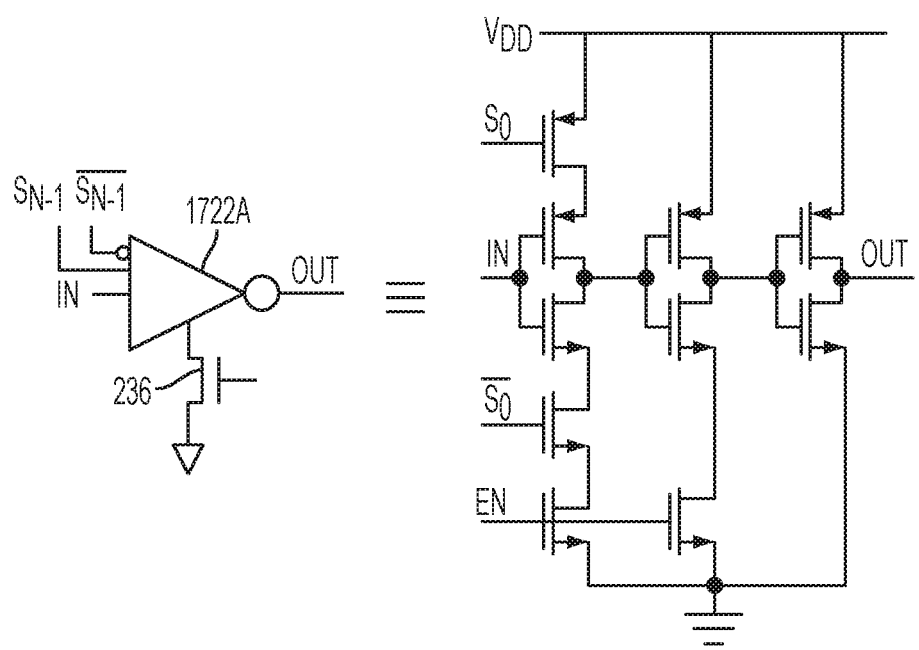
FIG. 17C is a circuit diagram illustrating an inverting element for other elements of the ring divider of FIG. 17A according to one embodiment of the disclosure.

Another embodiment of a ring frequency divider with stuck state elimination is shown in FIG. 17A. FIG. 17A is a circuit diagram illustrating a 7-stage ring divider with improved suck state elimination according to another embodiment of the disclosure. In ring frequency divider 1700, a single slave output and an inverted version of the slave output are fed to all odd elements except the last odd element. Such a configuration may improve the layout efficiency for the master-slave ring divider. For example, odd elements may be replaced with elements 1722A-N. One embodiment of element 222A for FIG. 17A is shown in FIG. 17B. FIG. 17B is a circuit diagram illustrating an inverting element for some elements of the ring divider of FIG. 17A according to one embodiment of the disclosure. One embodiment of element 1722A for FIG. 17A is shown in FIG. 17C. FIG. 17C is a circuit diagram illustrating an inverting element for other elements of the ring divider of FIG. 17A according to one embodiment of the disclosure.

The schematic flow chart diagram of FIG. 3 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although analog-to-digital converters (ADCs) are described throughout the detailed description, aspects of the invention may be applied to the design of other converters, such as digital-to-analog converters (DACs) and digital-to-digital converters, or other circuitry and components based on delta-sigma modulation. Further, although ones (1s) and zeros (0s) are given as example bit values throughout the description, the function of ones and zeros may be reversed without change in operation of the processor described in embodiments above. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A ring divider, comprising:
   a first master ring oscillator configured to oscillate at a first frequency determined by an applied signal; and
   a second slave ring oscillator interconnected to the first ring oscillator, wherein the second ring oscillator is configured by the interconnection with the first ring oscillator to operate at a second frequency that is the first frequency divided by an integer.

2. The ring divider of claim 1, wherein the first ring oscillator comprises a first plurality of latches configured in a chain such that an input of each of the plurality of latches is an output of a different one of the first plurality of latches, and wherein the second ring oscillator comprises a second plurality of latches configured in a chain such that an input of each of the second plurality of latches is an output of a different one of the second plurality of latches.

3. The ring divider of claim 2, further comprising a plurality of enable switches, wherein each of the second plurality of latches is coupled to a power supply through one of the plurality of enable switches, and wherein each of the plurality of enable switches is coupled to and toggled by an output of one of the first plurality of inverters.

4. The ring divider of claim 1, wherein the plurality of enable switches consists of n-channel metal-oxide-semiconductor (NMOS) devices.

5. The ring divider of claim 1, further comprising a decoder coupled to the first ring oscillator and the second ring oscillator.

6. The ring divider of claim 5, wherein the first ring oscillator and the second ring oscillator generate an output based, at least in part, on a redundant numbering system, and wherein the decoder converts the output to a non-redundant numbering system.

7. The ring divider of claim 5, wherein the first ring oscillator, the second ring oscillator, and the decoder are coupled together to form a ring divider-based counter.

8. The ring divider of claim 1, further comprising a stuck state eliminator circuit coupled to at least one element of the second ring oscillator, wherein the stuck state eliminator circuit is configured to correct an error in at least one element of the second ring oscillator.

9. The ring divider of claim 1, wherein at least one element of the second ring oscillator comprises a latch configured to provide integrated stuck state elimination.

10. The ring divider of claim 9, wherein the latch configured to provide integrated stuck state elimination comprises a gated buffer followed by an inverter.

11. The ring divider of claim 9, wherein the latch configured to provide integrated stuck state elimination comprises an element with three inputs comprising a first input coupled to an output of a previous element of the second ring oscillator, a second input coupled to an output of an element of the second ring oscillator prior to the previous element, and a third input coupled to an inverted output of the first element of the second ring oscillator.

12. The ring divider of claim 1, further comprising a third ring oscillator interconnected to the second ring oscillator, wherein the third ring oscillator is configured to operate at a third frequency that is the second frequency divided by an integer multiple.

13. A method, comprising:
causing a first master ring oscillator to oscillate at a first frequency determined by an applied signal; and
dividing the first frequency in a second slave ring oscillator by driving the second ring oscillator from outputs of the first ring oscillator at a second frequency that is the first frequency divided by an integer.

14. The method of claim 13, wherein the step of causing the first ring oscillator to oscillate comprises applying a signal to a power supply input of a first plurality of elements of the first ring oscillator such that an output of each element of the first plurality of elements drives an input of a next element of the first plurality of elements to switch at the first frequency, and wherein the step of driving the second ring oscillator comprises applying a plurality of outputs of the plurality of elements of the first ring oscillator to a power supply input of a second plurality of elements of the second ring oscillator.

15. The method of claim 14, wherein the step of applying the plurality of outputs of the plurality of elements of the first ring oscillator to the power supply input of the second plurality of elements of the second ring oscillator comprises applying the plurality of outputs to a plurality of enable switches coupled between a power supply rail and the power supply input of the second plurality of elements.

16. The method of claim 13, further comprising decoding outputs of the first ring oscillator and the second ring oscillator to obtain a value.

17. The method of claim 16, wherein the steps of causing the first ring oscillator and driving the second ring oscillator generate a redundant numbering system, and wherein the step of decoding the outputs comprises converting the redundant numbering system to a non-redundant numbering system.

18. The method of claim 13, wherein the step of driving the second ring oscillator comprises driving at least one element of the second ring oscillator out of a stuck state.

19. The method of claim 18, wherein the step of driving the at least one element of the second ring oscillator out of the stuck state comprises correcting an error in a state of the at least one element.

20. The method of claim 18, wherein the step of driving the at least one element of the second ring oscillator out of the stuck state comprises comparing an output of the at least one element to an output of a previous element in the second ring oscillator.

21. The method of claim 13, further comprising driving a third ring oscillator from outputs of the second ring oscillator at a third frequency that is the second frequency divided by an integer.

22. An analog-to-digital converter (ADC), comprising:
an input node configured to receive an input analog signal;
a current-controlled oscillator configured to receive the input analog signal, the current-controlled oscillator comprising:
a first master ring oscillator configured to be driven at a first frequency determined by the input analog signal; and
a second slave ring oscillator interconnected to the first ring oscillator, wherein the second ring oscillator is configured by the interconnection with the first ring oscillator to operate at a second frequency that is the first frequency divided by an integer such that the second ring oscillator and the first ring oscillator form a ring divider,
wherein the first ring oscillator comprises a first plurality of latches configured in a chain such that an input of each of the plurality of latches is an output of a different one of the first plurality of latches, and wherein the second ring oscillator comprises a second plurality of latches configured in a chain such that an input of each of the second plurality of latches is an output of a different one of the second plurality of latches; and
a decoder coupled to an output of the current-controlled oscillator and configured to output digital bits representing the input analog signal.

23. The ADC of claim 22, wherein the decoder comprises:
a sampling circuit coupled to an output of the current-controlled oscillator;
a phase decoder coupled to an output of the sampling circuit; and
a differentiator coupled to an output of the phase decoder.

24. The ADC of claim 22, wherein the current-controlled oscillator further comprises a plurality of enable switches, wherein each of the second plurality of latches is coupled to a power supply through one of the plurality of enable switches, and wherein each of the plurality of enable switches is coupled to and toggled by an output of one of the first plurality of inverters.

25. The ADC of claim 22, wherein the first ring oscillator and the second ring oscillator generate an output based, at least in part, on a redundant numbering system, and wherein the decoder converts the output to a non-redundant numbering system.

26. The ADC of claim 22, wherein the current-controlled oscillator further comprises a stuck state eliminator circuit coupled to or integrated with at least one element of the second ring oscillator, wherein the stuck state eliminator circuit is configured to correct an error in at least one element of the second ring oscillator.

27. A phase-locked loop (PLL) system, comprising:
   an input node configured to receive an input signal of a first frequency;
   a phase frequency detector coupled to the input node;
   a charge pump coupled to the phase frequency detector;
   a low-pass filter coupled to the charge pump;
   a voltage-controlled oscillator configured to receive an output of the low-pass filter, the voltage-controlled oscillator comprising:
      a first master ring oscillator configured to be driven at a first frequency determined by the low-pass filter; and
      a second slave ring oscillator interconnected to the first ring oscillator, wherein the second ring oscillator is configured by the interconnection with the first ring oscillator to operate at a second frequency that is the first frequency divided by an integer such that the second ring oscillator and the first ring oscillator form a ring divider, wherein an output of the second ring oscillator is coupled to the phase frequency detector,
      wherein the first ring oscillator comprises a first plurality of latches configured in a chain such that an input of each of the plurality of latches is an output of a different one of the first plurality of latches, and wherein the second ring oscillator comprises a second plurality of latches configured in a chain such that an input of each of the second plurality of latches is an output of a different one of the second plurality of latches; and
   an output node coupled to the first ring oscillator of the voltage-controlled oscillator and configured to generate an output signal of a second frequency that is an integer multiple of the first frequency.

28. The PLL system of claim 27, wherein the voltage-controlled oscillator further comprises a plurality of enable switches, wherein each of the second plurality of latches is coupled to a power supply through one of the plurality of enable switches, and wherein each of the plurality of enable switches is coupled to and toggled by an output of one of the first plurality of inverters.

29. The PLL system of claim 27, wherein the voltage-controlled oscillator further comprises a stuck state eliminator circuit coupled to or integrated with at least one element of the second ring oscillator, wherein the stuck state eliminator circuit is configured to correct an error in at least one element of the second ring oscillator.

* * * * *